(12) United States Patent  (10) Patent No.: US 9,378,845 B2
You  (45) Date of Patent: Jun. 28, 2016

(54) SYSTEM FOR SIMULTANEOUSLY DETERMINING MEMORY TEST RESULT

(71) Applicant: UNITEST INC., Gyeonggi-do (KR)

(72) Inventor: Ho Sang You, Seoul (KR)

(73) Assignee: UNITEST INC., Yongin-si, Gyeonggi-do (KR)

( * ) Notice: Subject to any disclaimer, the term of this patent is extended or adjusted under 35 U.S.C. 154(b) by 96 days.

(21) Appl. No.: 14/446,424

(22) Filed: Jul. 30, 2014

(65) Prior Publication Data

US 2015/0039953 A1 Feb. 5, 2015

(30) Foreign Application Priority Data

Jul. 31, 2013 (KR) .......... 10-2013-0090908

(51) Int. Cl.
*G11C 29/00* (2006.01)
*G11C 29/10* (2006.01)
*G11C 29/12* (2006.01)
*G11C 29/36* (2006.01)

(52) U.S. Cl.
CPC .......... *G11C 29/10* (2013.01); *G11C 29/12015* (2013.01); *G11C 29/36* (2013.01)

(58) Field of Classification Search
None
See application file for complete search history.

(56) References Cited

U.S. PATENT DOCUMENTS

| 2005/0050409 A1* | 3/2005 | Cho | G11C 29/56 714/720 |
| 2008/0258749 A1* | 10/2008 | Yamada | G01R 31/31926 324/762.01 |
| 2015/0035561 A1* | 2/2015 | You | H03K 19/17792 326/39 |
| 2015/0039264 A1* | 2/2015 | You | G11C 29/022 702/176 |
| 2015/0039951 A1* | 2/2015 | You | G11C 29/12 714/718 |

FOREIGN PATENT DOCUMENTS

KR   10-0589465 B1   6/2006
KR   10-2009-0127689 A   12/2009

OTHER PUBLICATIONS

Korean Office Action dated Sep. 30, 2014.

* cited by examiner

*Primary Examiner* — Daniel McMahon
(74) *Attorney, Agent, or Firm* — Rabin & Berdo, P.C.

(57) ABSTRACT

A system for test plural memories simultaneously includes a pattern generation part which generates a pattern signal for testing and transmits the signal to the memories, a delay part which receives data through a first data line from a first memory device that is disposed in a closest position from the delay part and a second data line from a second memory device that is disposed in a farthest position from the delay part, and a determination part which determines the result of testing by comparing the data from the first memory device and the second memory device. The delay part output the first data and the second data to the determination part simultaneously.

3 Claims, 4 Drawing Sheets

SYSTEM FOR SIMULTANEOUSLY DETERMINING MEMORY TEST RESULT

BACKGROUND OF THE INVENTION

1. Field of the Invention

The present invention relates to a system for simultaneously determining the memory test result of semiconductor memory devices configured such that data recorded thereto is read again, and more particularly, to a system for simultaneously determining a memory test result, wherein when two or more memory devices as devices under test (DUTs) are placed in physically different positions, they may be simultaneously tested, regardless of the input time difference of the read data depending on the physical distance.

2. Description of the Related Art

Regarding semiconductor test devices, a plurality of patents including Korean Patent Application Publication No. 10-2009-0127689 (hereinafter referred to as "cited reference") has been applied and laid-open.

In this cited reference, the memory test device includes a general register for calculation using a predetermined general command; an extension register having a capacity greater than that of the general register and for calculation using a predetermined extension command; and a controller for writing a predetermined test pattern to an external memory using the extension command, reading the test pattern written to the memory, determining whether the written test pattern and the read test pattern are matched with each other, and determining whether the memory is faulty or not using the general command.

In conventional semiconductor test devices including cited reference, a memory device (DUT) is electrically coupled with a pattern generator for testing thereof.

FIG. 1 illustrates a typical structure for a memory burn-in test, including a pattern generator 1 for testing a memory device (DUT), a feed through board 3 for transmitting a signal, and a burn-in board 6 for testing.

Upon recording for a memory test in such a structure, a signal is output from the pattern generator 1 and then recorded in the sequence of from a closest memory device 4 that is disposed closer to the pattern generator to a last memory device 5 that is disposed farther from the pattern generator, among memory devices mounted on the burn-in board 6.

On the other hand, in order to determine whether the read data is matched with the recorded data, the data is sequentially read from the closest memory device 4 to the last memory device 5 and thus whether it is normal or not is checked.

In this procedure, because the closest memory device 4 and the last memory device 5 are physically distant from each other, a difference in data input time is created and becomes apparent upon reading of the data.

FIG. 2 schematically illustrates the electrical connection thereof.

As illustrated in FIG. 2, an address line and a command line 7 are connected with a common line, and a data line 8 is connected so as to be commonly electrically conductive. As such, chip selection (CS) pins are separately connected, so that the closest memory device 4 that is disposed closer and the farthest memory device 5 that is disposed farther allow for an individual reading function.

Specifically, a command is sequentially applied to the memory devices 4, 5 as seen in FIG. 2, and then read in the applied sequence, thus obtaining data. In this procedure, because the closest memory device 4 and the farthest memory device 5 are physically distant from each other, the data arrival time may be different. As such, this structure includes a single data path connected between the closest memory device 4 and the farthest memory device 5, and thus a single determination clock (a strobe clock) may be applied. Moreover, to overcome the time difference, a strobe clock as the determination clock is adjusted so as to be variable for a predetermined period of time.

SUMMARY OF THE INVENTION

Accordingly, the present invention has been made keeping in mind the above problems occurring in the prior art, and an object of the present invention is to provide a system for simultaneously determining a memory test result, wherein, unlike in a conventional case where a strobe clock as a determination clock is adjusted to be variable for a predetermined period of time to overcome the input time difference of data caused upon inputting and reading a command for determination in the sequence of two or more memory devices (DUTs) which are placed in physically different positions, data of a closest memory device (DUT) that is disposed closer to the system is output late up to equal the input time of a farthest memory device (DUT) that is disposed farther from the system, and thereby, two or more memory devices (DUTs) may be simultaneously tested, regardless of the input time difference of the read data depending on the physical distance.

In order to accomplish the above object, the present invention provides a system for simultaneously determining a memory test result, comprising: a pattern generation part for generating a pattern signal for testing to transmit the signal through an address line and a command line; a delay part for receiving through a first data line read data from a closest memory device and receiving through a second data line read data from a farthest memory device, the memory devices being mounted on the burn-in board; and a determination part for simultaneously testing the read data from the closest memory device and the read data from the farthest memory device, which are simultaneously output from the delay part, using one determination clock, wherein the delay part may recognize inputs of the read data from the closest memory device and the read data from the farthest memory device, and delay the output of the read data from the closest memory device by time difference of the inputs.

The determination part may determine whether the read data from the closest memory device and the read data from the farthest memory device, which are simultaneously output from the delay part, are matched with data recorded to the closest memory device and data recorded to the farthest memory device, thus checking whether the corresponding data is normal or not.

The length of the address line and the command line of the closest memory device may be the same as the length of the first data line.

The length of the address line and the command line connected to the farthest memory device may be the same as the length of the second data line.

According to the present invention, two or more memory devices (DUTs) which are placed in physically different positions can be simultaneously tested using a single determination clock, regardless of the input time difference of the read data, thus obviating the need for an additional logic circuit, ultimately reducing temporal and economic loss.

BRIEF DESCRIPTION OF THE DRAWINGS

The above and other objects, features and advantages of the present invention will be more clearly understood from the following detailed description taken in conjunction with the accompanying drawings, in which:

FIG. 1 illustrates a typical structure for memory burn-in test.

DESCRIPTION OF SPECIFIC EMBODIMENTS

Hereinafter, a detailed description will be given of the present invention with reference to the appended drawings. In the following description, it is noted that, when the detailed description of known techniques related with the present invention may make the gist of the present invention unclear, a detailed description thereof will be omitted.

Figure 1:
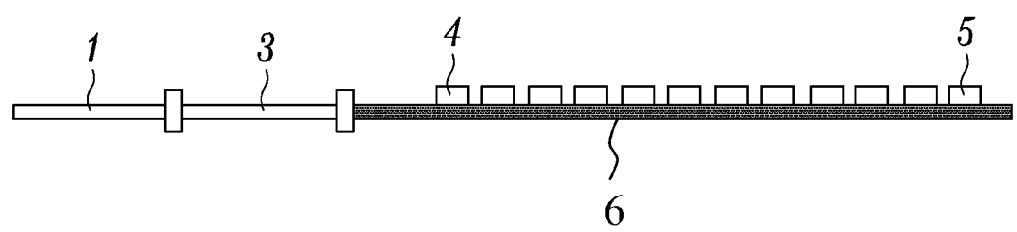
Figure 2:
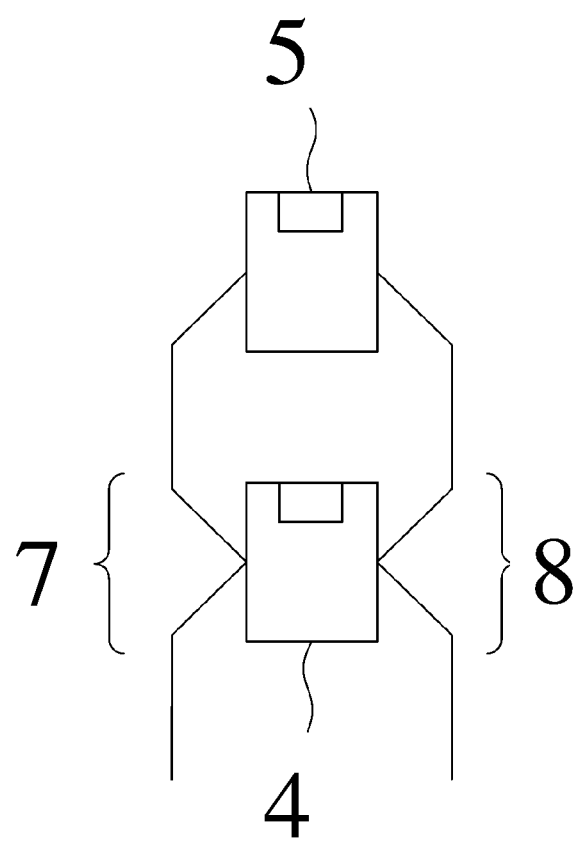
FIG. 2 schematically illustrates the electrical connection of the structure of FIG. 1.
Figure 3:
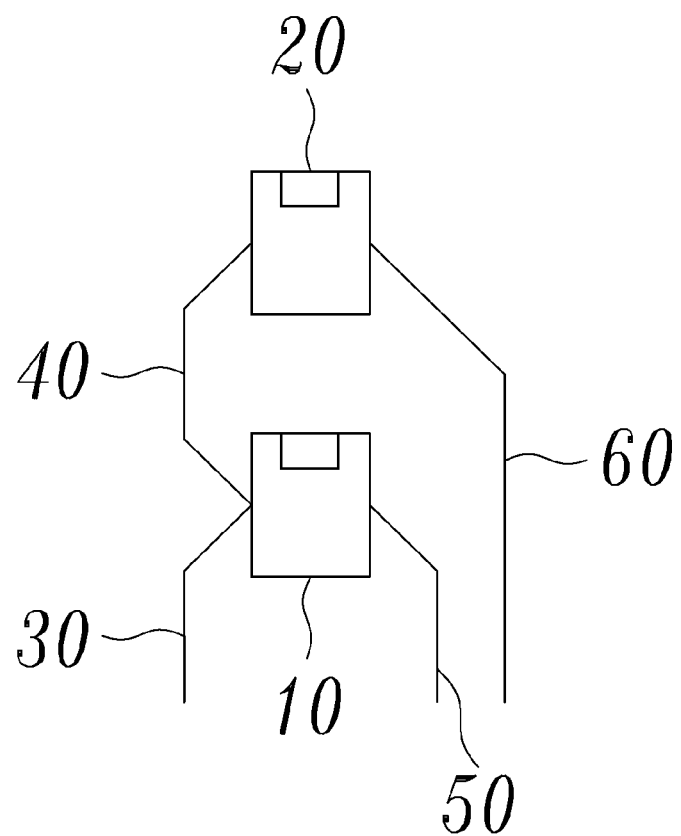
FIG. 3 illustrates the serial connection of two or more memory devices which are placed in physically different positions according to the present invention.
Figure 4:
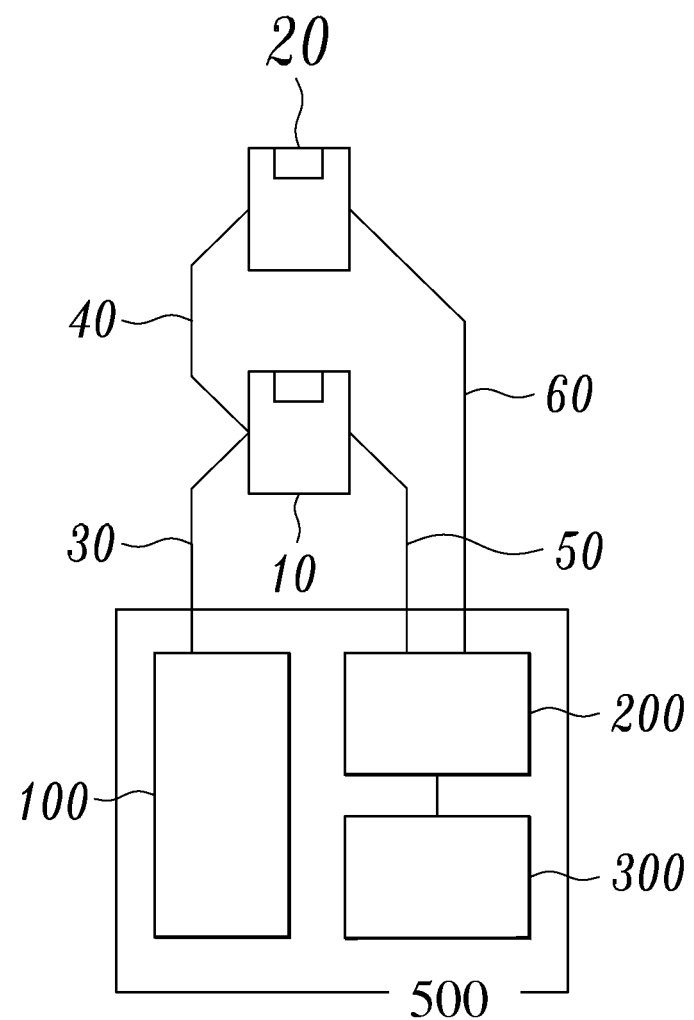
FIG. 4 illustrates a system for simultaneously determining a memory test result according to the present invention.

With reference to FIGS. 3 and 4, a system for simultaneously determining a memory test result according to the present invention is described below.

As illustrated in FIG. 3, when two or more memory devices 10, 20 which are placed in physically different positions are serially connected, the address line and the command line 30, 40 of a closest memory device 10 that is disposed closer to the system and a farthest memory device 20 that is disposed farther from the system are commonly connected, and the first data line 50 of the closest memory device 10 and the second data line 60 of the farthest memory device 20 are connected with a pattern generator.

As such, the length of the address line 30 of the closest memory device 10 is the same as the length of the first data line 50. Also, the length of the address line and the command line 30, 40 connected to the farthest memory device 20 should be the same as the length of the second data line 60.

In the structure as shown in FIG. 3, as signals are simultaneously input upon data recording, no problems occur. However, when such signals are read again, the first data line 50 of the closest memory device 10 and the second data line 60 of the farthest memory device 20 are separated from each other and thus the input path and the arrival time of data become different. Hence, in order to simultaneously read the data from two memory devices 10, 20, different determination clocks are required.

When two or more memory devices (DUTs) are used in this way, determination strobe clocks corresponding to the number of the memory devices have to be used. In the event of the testing being limited in resources, a gate array may provide only clocks which may be maximally used. Also, even when a plurality of clocks is used, there is a need for an additional logic circuit for logic determination thereof, undesirably negating temporal and economic benefits.

To overcome such problems, the present invention creates a delay time that can be up to equal the input time difference between the data of the closest memory device (DUT) that is disposed closer to the system and the read data of the farthest memory device (DUT) that is disposed farther from the system.

FIG. 4 illustrates a testing device 500 for simultaneously determining the test result of memory devices which are physically distant from each other, included in a pattern generator on a board according to the present invention. As illustrated in FIG. 4, the testing device 500 includes a pattern generation part 100, a delay part 200 and a determination part 300.

The pattern generation part 100 is configured such that a pattern signal for testing is generated and transmitted through an address line and a command line 30, 40.

The delay part 200 is configured to receive the read data through the first data line 50 from the closest memory device 10 that is disposed closer to the system and to receive the read data through the second data line 60 from the farthest memory device 20 that is disposed farther from the system, the memory devices being mounted on the burn-in board.

The read data of the closest memory device 10 that is disposed closer to the testing device 500 including in the pattern generator is first input, and the read data of the farthest memory device 20 that is disposed farther from the testing device 500 is then input.

Specifically, the delay part 200 recognizes the read data of the closest memory device 10 and the read data of the farthest memory device 20, so that the read data of the closest memory device 10 is output late up to equal the input time difference of the read data of the farthest memory device 20.

The determination part 300 functions to simultaneously test the read data of the closest memory device 10 and the read data of the farthest memory device 20, which are simultaneously output from the delay part 200, using a single determination clock.

Specifically, the determination part 300 determines whether the read data of the closest memory device 10 and the read data of the farthest memory device 20, which are simultaneously output from the delay part 200, are matched with the data recorded to the memory devices 10, 20, thus checking whether the corresponding data is normal or not.

In the present embodiment, FIGS. 3 and 4 illustrate only the two memory devices, but the present invention is not limited thereto, and two or more memory devices may be applied for testing.

The system for simultaneously determining a memory test result having the aforementioned constructions and functions according to the present invention is advantageous because two or more memory devices (DUTs) which are physically distant from each other may be simultaneously tested using a single determination clock, regardless of the input time difference of the read data.

Although the embodiments of the present invention have been disclosed for illustrative purposes, those skilled in the art will appreciate that a variety of different variations and modifications are possible, without departing from the scope and spirit of the invention as disclosed in the accompanying claims. Accordingly, such variations and modifications should also be understood as falling within the scope of the present invention.

What is claimed is:

1. A system for testing plural memories simultaneously, comprising:
   two or more memory devices mounted on a burn-in board and spaced apart from each other; and
   a testing device configured to test said two or more memory devices simultaneously and including
      a pattern generation part generating a pattern signal for testing and transmitting the pattern signal to said two or more memory devices through an address line and a command line commonly connected to all of said two or more memory devices,
      a delay part receiving first data through a first data line from a first memory device which is disposed in a closest distance from the testing device and second data through a second data line from a second memory device which is disposed in a farther distance from the testing device than the first memory device, wherein the second data line is separated from the first data line, and a determination part receiving the first data and the second data simultaneously from the delay part and testing said two or more memory devices by comparing the first data with the second data, wherein the delay part is configured to recognize an input time difference between the first data from the first memory device and the second data from the second memory device and delays outputting the first data to the determination part for a time corresponding to the input time difference in order to simultaneously output both the first data and the second data.

2. The system of claim 1, wherein a length of the address line and the command line between the testing device and the first memory device is same as a length of the first data line.

3. The system of claim 1, wherein a length of the address line and the command line between the testing device and the second memory device is same as a length of the second data line.

\* \* \* \* \*